(12) United States Patent
Lee

(10) Patent No.: US 6,234,788 B1
(45) Date of Patent: May 22, 2001

(54) DISK FURNACE FOR THERMAL PROCESSING

(75) Inventor: Chunghsin Lee, Lynnfield, MA (US)

(73) Assignee: Applied Science and Technology, Inc., Wilmington, MA (US)

( * ) Notice: Subject to any disclaimer, the term of this patent is extended or adjusted under 35 U.S.C. 154(b) by 0 days.

(21) Appl. No.: 09/433,859

(22) Filed: Nov. 4, 1999

Related U.S. Application Data

(60) Provisional application No. 60/107,082, filed on Nov. 5, 1998.

(51) Int. Cl.[7] ............................. H01L 21/68; B65G 49/07

(52) U.S. Cl. ...................... 432/124; 432/141; 432/239; 414/936; 414/937; 118/719; 118/730

(58) Field of Search ........................ 432/124, 126, 432/131, 141, 239; 414/936, 937, 938; 118/318, 319, 320, 620, 630, 641, 722, 730, 719

(56) References Cited

U.S. PATENT DOCUMENTS

| | | | |
|---|---|---|---|
| 5,091,217 | * | 2/1992 | Hey et al. ............................ 118/719 |
| 5,404,894 | * | 4/1995 | Shiraiwa ............................. 432/239 |
| 5,766,360 | * | 6/1998 | Sato et al. .......................... 118/719 |
| 5,944,940 | * | 8/1999 | Toshima ............................. 414/938 |
| 5,951,770 | * | 9/1999 | Perlov et al. ....................... 118/719 |

* cited by examiner

*Primary Examiner*—Gregory Wilson
(74) *Attorney, Agent, or Firm*—Testa, Hurwitz & Thibeault, LLP

(57) ABSTRACT

A furnace for thermal processing of substrates includes a substrate cassette that supports at least one substrate and a process chamber for thermal processing. A process chamber that includes a port for receiving a substrate, a heater that generates a thermal distribution, and a rotatable member having a substrate support. The rotatable member rotates a substrate positioned on the substrate support so that a temperature of the substrate is controlled according to a temperature profile. A transport mechanism transports substrates between the substrate cassette and the substrate support of the rotatable member.

28 Claims, 2 Drawing Sheets

DISK FURNACE FOR THERMAL PROCESSING

RELATED APPLICATIONS

This application claims the benefit of U.S. Provisional application Ser. No. 60/107,082, filed Nov. 5, 1998.

FIELD OF THE INVENTION

The invention relates generally to apparatus and methods for thermal processing of substrates.

BACKGROUND

Several types of furnaces are used in the materials processing industry. For example, one type of furnace used for thermal processing in the semiconductor industry is a batch furnace. Batch furnaces typically include a large area that supports and thermally processes multiple substrates simultaneously. Batch furnaces are relatively simple because they have no internal moving parts. However, they are typically energy inefficient and have relatively low throughput and long processing times. In addition, batch furnaces typically can not generate complex or rapid thermal profiles that are required for some applications.

Another type of furnace used in the industry for thermal processing is a belt furnace. Belt furnaces typically comprise an elongated passageway and a plurality of heating elements positioned at locations along the passageway. In operation, substrates are loaded onto a belt or conveyor and transported through the passageway in proximity to the plurality of heating elements at a predetermined speed.

Typically, each of the plurality of heating elements is individually controllable to achieve a predetermined thermal profile. The rate of transport though the passageway is also controllable. Consequently, belt furnaces can achieve a predetermined thermal profile that can be both complex and rapid. Belt furnaces can achieve a significantly higher ramp rate compared to batch furnaces. For example, belt furnaces can heat a substrate with a ramp rate greater than 100 degrees per minute, and cool a substrate with a ramp rate greater than 30 degrees per minute. Such ramp rates are required for certain manufacturing processes, such as reflow processes.

Belt furnaces are generally more energy efficient and simpler to use compared to batch furnaces and can be used to generate complex and rapid thermal profiles. In addition, belt furnaces are less expensive than batch furnaces. However, belt furnaces have a relatively large footprint, and therefore take up valuable clean room space. Belt furnaces also have a long warm-up time, and are relatively difficult to automate. In addition, it is difficult to control the ambient temperature within a belt furnace.

SUMMARY OF THE INVENTION

The present invention relates to a furnace for thermal processing of materials such as semiconductor substrates. It is an object of the invention to provide a furnace that has a relatively high ramp up and ramp down rate. It is another object of the present invention to provide a furnace that has a relatively small physical footprint.

Accordingly, the present invention features a furnace for thermal processing of substrates. The furnace includes a substrate cassette that supports at least one substrate. A vacuum chamber having a gate valve may enclose the substrate cassette. A cassette elevator may be included to vertically position the substrate cassette relative to a transport mechanism.

The furnace also includes a process chamber having a port for receiving and removing substrates from the process chamber. The process chamber may be a cylindrical chamber. A gate valve may be positioned in the port of the process chamber that creates a vacuum seal at the port. An ambient control chamber may be positioned between the process chamber and the substrate cassette. At least one gas transport member may be positioned in the process chamber that introduces a gas into the process chamber. The gas transport member may include an arm that extends radially from the center of the process chamber.

A rotatable member that includes a substrate support is rotatably disposed in the processing chamber. The rotatable member rotates a substrate positioned on the substrate support so that a temperature of the substrate is controlled according to a temperature profile. In one embodiment, the rotatable member comprises a disk-shaped member. A motor drive may be coupled to the rotatable member in order to power the rotation. The motor drive may be coupled to the rotatable member through a vacuum feedthrough. In one embodiment, a controller is in electrical communication with the motor drive and causes the motor drive to rotate the rotatable member at a predetermined time and at a rotation rate.

A heater is positioned in thermal communication with the process chamber. The heater may be positioned on at least one of a top and a bottom of the process chamber. The heater generates a thermal distribution in the process chamber. In one embodiment, the heater includes a plurality of heating elements that are individually controllable. Each of the plurality of heating elements generates a thermal distribution in a respective one of a plurality of regions of the process chamber. A transport mechanism transports substrates between the substrate cassette and the substrate support of the rotatable member. The transfer mechanism may be a robot arm.

The present invention also features a method for thermal processing of materials. The method includes transporting a substrate through a port of a process chamber to a substrate support disposed in the process chamber. A thermal distribution is generated in the process chamber. The thermal distribution in the process chamber may be generated by heating a plurality of regions of the process chamber. The furnace may have a temperature ramp up rate of at least 100 degrees per minute and a temperature ramp down rate of at least 30 degrees per minute. The substrate is rotated through the thermal distribution to expose the substrate to a temperature profile. The substrate is then transported out of the process chamber through the port of the process chamber.

BRIEF DESCRIPTION OF THE DRAWINGS

This invention is described with particularity in the appended claims. The above and further advantages of this invention can be better understood by referring to the following description taken in conjunction with the accompanying drawings, in which:

DETAILED DESCRIPTION OF INVENTION

Figure 1:
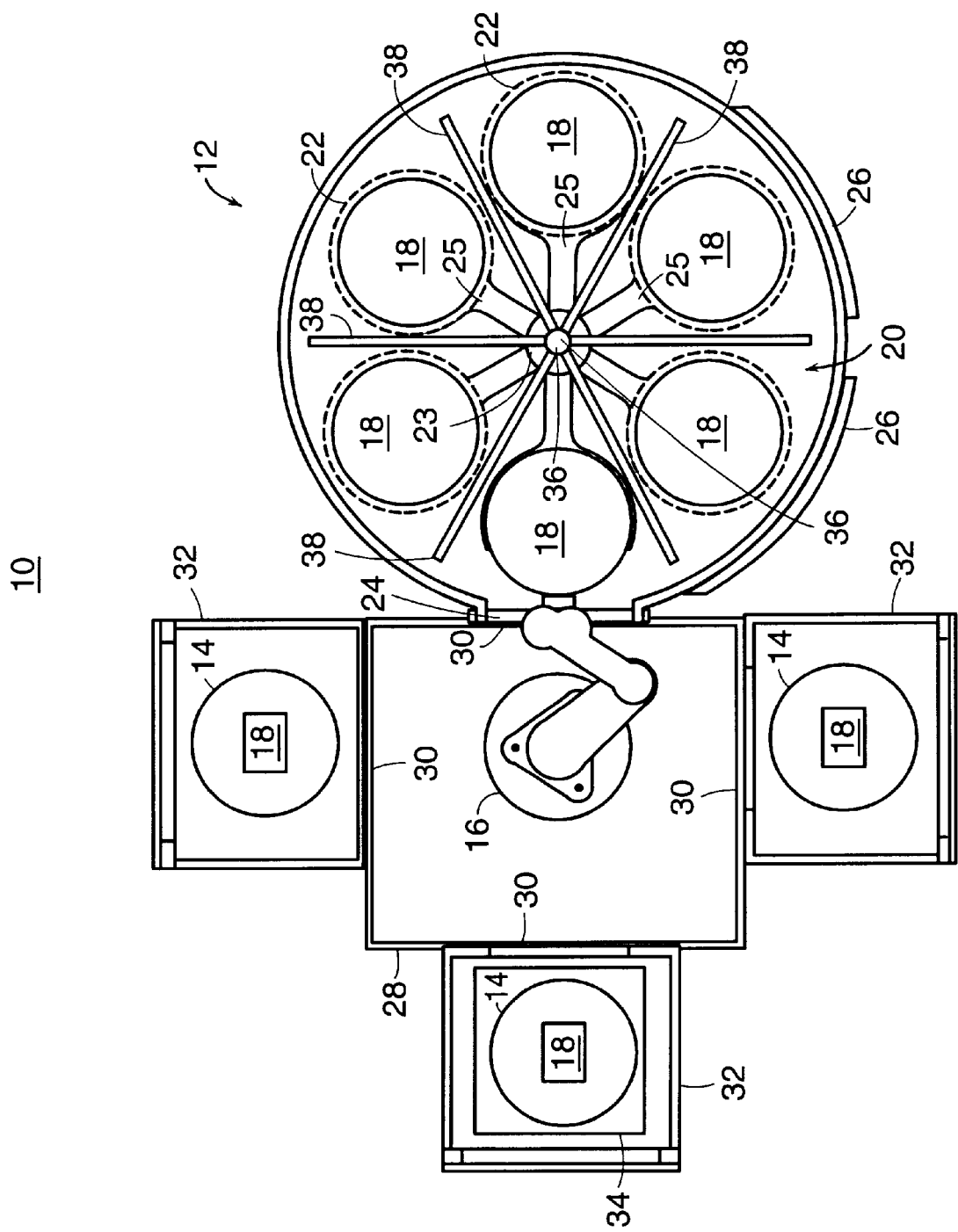
FIG. 1 is a top, partial cross-sectional view of an embodiment of a furnace constructed according to the present invention.

FIG. 1 is a top partial cross-sectional view of one embodiment of a furnace 10 constructed according to the present invention. The furnace 10 includes a process chamber 12, a substrate cassette 14, and a transport mechanism 16. The transport mechanism 16 transports a substrate 18 between the process chamber 12 and the substrate cassette 14. The process chamber 12 includes a rotatable member 20 that comprises a plurality of substrate supports 22 that are rotatably disposed in the process chamber 12. The process chamber 12 includes a port 24 for receiving and removing substrates 18. The furnace 10 also includes a heater 26 that generates a thermal distribution in the process chamber 12. In one embodiment, the furnace 10 includes an ambient control chamber 28 that is coupled to the process chamber 12.

The substrate cassette 14 holds at least one substrate 18 in storage for thermal processing. The substrate cassette 14 may hold a batch of substrates 18. In one embodiment, the furnace 10 includes a plurality of substrate cassettes 14. A transport mechanism 16 transports the substrate 18 between the substrate cassette 14 and the plurality of substrate supports 22 of the rotatable member 20 disposed in the process chamber 12. In one embodiment, the transport mechanism 16 is a robot arm, as shown in FIG. 1. The robot arm 16 may be controlled by a processor.

In one embodiment, the furnace 10 includes a separate ambient control chamber 28 that is in communication with the process chamber 12, as shown in FIG. 1. A gate valve 30 which forms a vacuum seal may be positioned between the ambient control chamber 28 and the process chamber 12. In one embodiment, the robot arm 16 is positioned in the ambient control chamber 28, as shown in FIG. 1. One advantage of the disk furnace 10 of the present invention over prior art furnaces is that it provides an ambient control chamber 28 that is physically separate from the process chamber 12.

The substrate cassette 14 may be positioned in a vacuum chamber 32, as shown in FIG. 1. The vacuum chamber 32 may be coupled to the ambient control chamber 28 through another gate valve 30, which forms a vacuum seal between the ambient control chamber 28 and the vacuum chamber 32. In one embodiment, the furnace 10 further includes at least one cassette elevator 34 disposed in the vacuum chamber 32. The cassette elevator 34 vertically positions the substrate cassette 14 relative to the transport mechanism 16, so that the transport mechanism 16 can retrieve one of a plurality of substrates 18 from the substrate cassette 14.

In one embodiment of the invention, the process chamber 12 is a thin, hollow, cylindrical chamber. The process chamber 12 includes a port 24 for receiving and removing substrates 18 from the process chamber 12. In one embodiment, the port 24 of the process chamber 12 includes another gate valve 30 that creates a vacuum seal at the port 24 of the process chamber 12.

The process chamber 12 also includes a rotatable member 20 that is rotatably disposed in the chamber. The rotatable member 20 includes at least one substrate support 22 for holding a substrate 18. The rotatable member 20 may have a circular cross-section. In one embodiment, the substrate support 22 includes a central member 23, and a plurality of carrier arms 25 that extend radially from the central member 23, as shown in FIG. 1. Each carrier arm 25 terminates in a carrier pad 22 adapted to hold a substrate 18. There are numerous other embodiments of the rotatable member 20 of the present invention. For example, the rotatable member 20 may be a disk-shaped member.

One advantage of the disk furnace 10 of the present invention is that the substrates 18 are transported in and out of the process chamber 12 from a single location. This feature results in a more compact design than the prior art belt furnaces in which substrates are received from one end and retrieved from another end. The compact design results in a smaller footprint, which saves valuable clean room space. The compact design also results in a shorter warm-up time.

A heater 26 is positioned in thermal communication with the process chamber 12 and generates a thermal distribution in the process chamber 12. The heater 26 may be positioned on the top or the bottom or both the top and bottom of the process chamber 12. In addition, the heater may be positioned inside or outside of the process chamber. In one embodiment, the heater 26 is positioned in thermal communication with a plurality of regions of the process chamber.

The heater 26 may include a plurality of heating elements 27 (FIG. 2) where each of the plurality of heating elements 27 generates a thermal distribution in a respective one of the plurality of regions of the process chamber. Each of the plurality of the heating elements 27 may be individually controllable, so that the temperature of each heating element 27 and thus the thermal distribution generated by each heating element, is determined separately. A controller or processor (not shown) may control the temperature of each of the heating elements so that each of the thermal distributions are predetermined. The temperature ramp up rate of the furnace 10 may be greater than about 100 degrees per minute and the temperature ramp down rate of the furnace 10 may be greater than about 30 degrees per minute.

In one embodiment, the furnace 10 further includes at least one gas transport member 36 positioned in the process chamber 12, as shown in FIG. 1. The gas transport member 36 introduces a gas from a gas source (not shown) into the process chamber 12. The gas transport member 36 may comprise a gas transport arm 38 that radially extends from the center of the chamber 12, and which dispenses a gas into a section of the process chamber 12. Gas may be introduced into the chamber 12 before, during, and after the thermal processing. The gas may be a toxic or a flammable gas.

Figure 2:
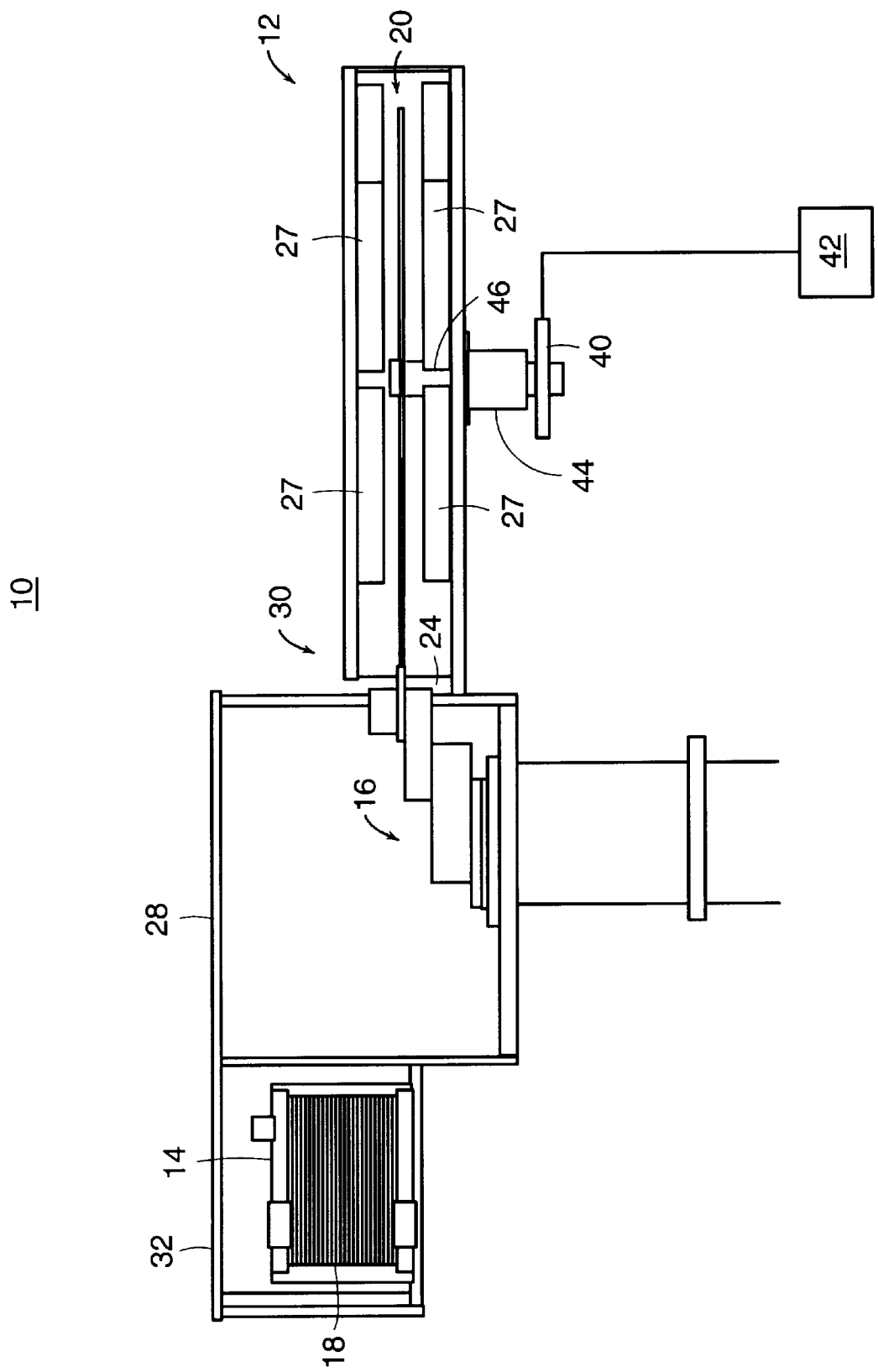
FIG. 2 is a side cross-sectional view of an embodiment of a furnace constructed according to the present invention.

FIG. 2 is a side cross-sectional view of an embodiment of a furnace 10 constructed according to the present invention. FIG. 2 illustrates a cross-sectional view of a plurality of heating elements 27, which are attached to both the top and bottom of the cylindrical process chamber 12. FIG. 2 also illustrates a plurality of substrates 18 disposed in the substrate cassette 14. In addition, FIG. 2 illustrates a cross-sectional view of the robot arm 16 that is positioned in the ambient control chamber 28.

As shown in FIG. 2, the rotatable member 20 may be connected to a motor drive 40 that drives the rotatable member 20. A controller 42 that provides instructions to the motor drive 40 may be electrical coupled to the motor drive 40. The controller 42 may be a closed loop motion controller. The controller 42 may instruct the motor drive 40 to rotate the rotatable member 20 at a predetermined time and at a rotation rate. The controller 42 may instruct the motor drive 42 to drive the rotatable member 20 in a continuous or a stepwise fashion.

The process chamber 12 may include a vacuum feedthrough 44, which couples a drive shaft 46 to the motor drive 40 and the rotatable member 20, while maintaining a vacuum seal. The rotatable member 20 rotates around the drive shaft 46 when driven by the motor drive 40. The vacuum feedthrough 44 may also feedthrough services such as electrical power for internal heating elements and gas for the gas transport arms 38.

In operation, a substrate 18 is placed in the substrate cassette 14 disposed in the vacuum chamber 32. The vacuum chamber 32, ambient control chamber 28, and process chamber 12 may be pumped down to a vacuum. The gate valve 30 between the vacuum chamber 32 and the ambient control chamber 28 is opened, and the robot arm 16 retrieves a substrate 18 from the substrate cassette 14. The gate valve 30 positioned in the port 24 is opened. The robot arm 16 transports the substrate 18 into the process chamber 12, through the port 24 of the process chamber 12 and places the substrate 18 on a substrate support 22. This process may be repeated until substrates 18 are placed on all of the substrate supports 22. The gate valve 30 in the port 24 is closed and the substrate is now positioned in the process chamber for thermal processing.

The gas transport arm 38 may dispense a gas from a gas source to the substrate 18 before thermal processing. The heater 26 then heats the process chamber 12 to generate a thermal distribution in the process chamber 12 for thermal processing. In one embodiment, a plurality of independently controllable heating elements 27 generate a plurality of thermal distributions in the process chamber 12. The gas transport arm 38 may dispense a gas from a gas source into the process chamber 12. The rotatable member 20 rotates the substrate supports 22 in the process chamber. The substrate 18 is thus exposed to each of the plurality of thermal distributions in a respective one of the plurality of regions of the cylindrical process chamber 12. The substrate 18 may be rotated through the plurality of thermal distributions according to a predefined program.

When thermal processing of the substrate 18 in the process chamber 12 is complete, the gas transport arm 38 may dispense a gas to the process chamber 12. The gate valve 30 positioned in the port 24 is opened. The robot arm 16 retrieves the substrate 18 from the substrate support 22, and transports the substrate 18 out of the process chamber 12 through the port 24 and the ambient control chamber 28 and to the vacuum chamber 32 where the substrate is positioned in the substrate cassette 14. The gate valve 30 between the ambient control chamber 28 and the vacuum chamber 32 is then closed and the thermally processed substrate may be removed.

Equivalents

While the invention has been particularly shown and described with reference to specific preferred embodiments, it should be understood by those skilled in the art that various changes in form and detail can be made therein without departing from the spirit and scope of the invention as defined by the appended claims.

What is claimed is:

1. A furnace for thermal processing of substrates, the furnace comprising:
    a) a substrate cassette that supports at least one substrate;
    b) a process chamber comprising:
        i) a port for receiving and removing substrates from the process chamber;
        ii) a heater positioned in thermal communication with the process chamber that generates a thermal distribution in the process chamber; and
        iii) a rotatable member being rotatably disposed in the processing chamber and comprising a substrate support, the rotatable member rotating a substrate positioned on the substrate support so that a temperature of the substrate is controlled according to a temperature profile; and
    c) a transport mechanism that transports the at least one substrate between the substrate cassette and the substrate support of the rotatable member.

2. The furnace of claim 1 wherein the process chamber comprises a cylindrical chamber.

3. The furnace of claim 1 wherein the heater is positioned on at least one of a top and a bottom of the process chamber.

4. The furnace of claim 1 further comprising at least one cassette elevator that vertically positions the substrate cassette relative to the transport mechanism.

5. The furnace of claim 1 wherein the port of the process chamber comprises a gate valve that creates a vacuum seal at the port of the process chamber.

6. The furnace of claim 1 further comprising a vacuum chamber that encloses the substrate cassette.

7. The furnace of claim 1 further comprising an ambient control chamber coupled to the process chamber.

8. The furnace of claim 1 wherein the transfer mechanism comprises a robot arm.

9. The furnace of claim 1 wherein a temperature ramp up rate of the furnace is at least 100 degrees per minute.

10. The furnace of claim 1 wherein a temperature ramp down rate of the furnace is at least 30 degrees per minute.

11. The furnace of claim 1 wherein the rotatable member comprises a disk-shaped member.

12. The furnace of claim 1 further comprising a motor drive that is coupled to the rotatable member, wherein the motor drive rotates the rotatable member.

13. The furnace of claim 12 wherein the motor drive is coupled to the rotatable member through a vacuum feedthrough.

14. The furnace of claim 12 further comprising a controller in electrical communication with the motor drive, wherein the controller causes the motor drive to rotate the rotatable member at a predetermined time and at a rotation rate.

15. The furnace of claim 1 further comprising at least one gas transport member positioned in the process chamber that introduces a gas into the process chamber.

16. A furnace for thermal processing of substrates, the furnace comprising:
    a) a substrate cassette that supports at least one substrate;
    b) a process chamber comprising:
        i) a port for receiving and removing substrates from the process chamber;
        ii) a heater positioned in thermal communication with a plurality of regions of the process chamber, the heater controlling a temperature of each of the plurality of regions, thereby generating a thermal distribution in each of the plurality of regions of the process chamber; and
        iii) a rotatable member being rotatably disposed in the processing chamber and comprising a substrate support, the rotatable member rotating a substrate positioned on the substrate support in the process chamber so that a temperature of the substrate is controlled according to a predetermined temperature profile; and
    c) a transport mechanism that transports the at least one substrate between the substrate cassette and the substrate support of the rotatable member disposed in the process chamber.

17. The furnace of claim 16 wherein the heater comprises a plurality of heating elements, each of the plurality of heating elements generating a thermal distribution in a respective one of the plurality of regions.

18. The furnace of claim 17 wherein the plurality of heating elements are individually controllable.

19. The furnace of claim 16 further comprising at least one gas transport member that introduces a gas into the process chamber.

20. The furnace of claim 19 wherein the gas transport member comprises a gas transport arm that dispenses gas into a section of the process chamber.

21. The furnace of claim 16 wherein the port further comprises a gate valve.

22. A method for thermal processing of materials, the method comprising:
   a) transporting a substrate through a port of a process chamber to a substrate support disposed in the process chamber;
   b) generating a thermal distribution in the process chamber;
   c) rotating the substrate through the thermal distribution to expose the substrate to a temperature profile; and
   d) transporting the substrate out of the process chamber through the port of the process chamber.

23. The method of claim 22 wherein the step of transporting a substrate to the substrate support comprises transporting a substrate from a substrate cassette through the port of the process chamber to the substrate support disposed in the process chamber.

24. The method of claim 22 wherein the step of transporting the substrate out of the process chamber comprises transporting the substrate out of the process chamber through the port of the process chamber to the substrate carrier.

25. The method of claim 22 wherein the step of generating a thermal distribution in the process chamber comprises heating a plurality of regions of the process chamber.

26. The method of claim 22 further comprising the step of dispensing a gas into the process chamber.

27. The method of claim 22 wherein the thermal distribution in the process chamber is predetermined.

28. A method for thermal processing of materials, the method comprising:
   a) transporting a substrate through a port of a process chamber to a substrate support disposed in the process chamber;
   b) generating a thermal distribution in each of a respective one of a plurality of regions in the process chamber;
   c) rotating the substrate through the plurality of thermal distributions to expose the substrate to a plurality of temperature profiles; and
   d) transporting the substrate out of the process chamber through the port of the process chamber.

* * * * *